United States Patent
Matsuno et al.

(10) Patent No.: US 10,244,658 B2
(45) Date of Patent: Mar. 26, 2019

(54) HEAT CONDUCTIVE SHEET AND ELECTRONIC APPARATUS USING SAME

(71) Applicant: Panasonic Intellectual Property Management Co., Ltd., Osaka (JP)

(72) Inventors: Koji Matsuno, Hokkaido (JP); Kazuhiko Kubo, Hokkaido (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 13 days.

(21) Appl. No.: 15/563,649

(22) PCT Filed: Jun. 23, 2016

(86) PCT No.: PCT/JP2016/003025
§ 371 (c)(1),
(2) Date: Oct. 2, 2017

(87) PCT Pub. No.: WO2016/208192
PCT Pub. Date: Dec. 29, 2016

(65) Prior Publication Data
US 2018/0098461 A1  Apr. 5, 2018

(30) Foreign Application Priority Data
Jun. 26, 2015  (JP) .................... 2015-128250

(51) Int. Cl.
*G02F 1/1333* (2006.01)
*H05K 7/20* (2006.01)
*H01L 23/36* (2006.01)

(52) U.S. Cl.
CPC ... *H05K 7/20472* (2013.01); *G02F 1/133382* (2013.01); *G02F 1/133385* (2013.01); *H01L 23/36* (2013.01); *H05K 7/20954* (2013.01)

(58) Field of Classification Search
CPC ............ H05K 7/20472; H05K 7/20954; G02F 1/133382; G02F 1/133385; H01L 23/36
See application file for complete search history.

(56) References Cited

U.S. PATENT DOCUMENTS

| 2006/0098412 A1* | 5/2006 | Kim | .................... H05K 7/20963 361/704 |
| 2010/0302231 A1* | 12/2010 | Peng | .................... G06F 3/0481 345/214 |
| 2014/0322848 A1* | 10/2014 | Kim | .................... H01L 51/56 438/34 |

FOREIGN PATENT DOCUMENTS

| JP | 2010-010599 | 1/2010 |
| JP | 2011-105531 | 6/2011 |
| JP | 2014-061662 | 4/2014 |

OTHER PUBLICATIONS

International Search Report of PCT application No. PCT/JP2016/003025 dated Jul. 26, 2016.

* cited by examiner

*Primary Examiner* — Charles S Chang
(74) *Attorney, Agent, or Firm* — McDermott Will & Emery LLP

(57) ABSTRACT

A heat conductive sheet includes a heat dissipating sheet, a first heat insulating layer provided above the heat dissipating sheet, a first sheet provided above the first heat insulating layer, and a second sheet provided below the heat dissipating sheet. The first sheet includes a first protruding portion protruding from the heat dissipating sheet viewing from above. The second sheet includes a second protruding portion protruding from the heat dissipating sheet viewing from above. A thermal conductivity of the first heat insulating layer is lower than any of a thermal conductivity of the first sheet, a thermal conductivity of the second sheet, and a (Continued)

thermal conductivity of the heat dissipating sheet. The first protruding portion overlaps and the second protruding portion viewing from above.

10 Claims, 3 Drawing Sheets

HEAT CONDUCTIVE SHEET AND ELECTRONIC APPARATUS USING SAME

This application is a U.S. national stage application of the PCT international application No.PCT/JP2016/003025 filed on Jun. 23, 2016, which claims the benefit of foreign priority of Japanese patent application No. 2015-128250 filed on Jun. 26, 2015, the contents all of which are incorporated herein by reference.

TECHNICAL FIELD

The present disclosure relates to a heat conductive sheet for dissipating heat generated from a heat generating component, and an electronic apparatus using the heat conductive sheet.

BACKGROUND ART

As various types of electronic apparatuses have higher performance and more advanced functions, heat generating components in the apparatuses tend to generate a larger amount of heat. The heat generated from the heat generating component may affect adversely on the heat generating component or other electronic components of the heat generating component, and consequently may cause problems in operations of the electronic apparatus.

A heat conductive sheet for transmitting the heat generated from the heat generating component is disclosed in, for example, PTL 1 and PTL 2.

PTL 1 discloses a heat dissipating sheet having graphite, a protective layer, and a release sheet. The protective layer and the release sheet have respective protruding parts protruding in surface directions of graphite, and the protruding parts are joined to each other.

PTL 2 discloses a heat dissipation sheet in which an edge surface and both main surfaces of graphite are covered with a heat conductive adhesive agent.

CITATION LIST

Patent Literature

PTL 1: Japanese Patent Laid-Open Publication No. 2014-061662
PTL 2: Japanese Patent Laid-Open Publication No. 2010-010599

SUMMARY

A heat conductive sheet includes a heat dissipating sheet, a first heat insulating layer provided above the heat dissipating sheet, a first sheet provided above the first heat insulating layer, and a second sheet provided below the heat dissipating sheet. The first sheet includes a first protruding portion protruding from the heat dissipating sheet viewing from above. The second sheet includes a second protruding portion protruding from the heat dissipating sheet viewing from above. A thermal conductivity of the first heat insulating layer is lower than any of a thermal conductivity of the first sheet, a thermal conductivity of the second sheet, and a thermal conductivity of the heat dissipating sheet.

This heat conductive sheet can dissipate heat efficiently.

DETAIL DESCRIPTION OF EMBODIMENTS

Each of the exemplary embodiments described below illustrates a specific example. The numerical values, shapes, materials, structural elements, arrangements and connections of the structural elements, etc. shown in the following exemplary embodiments are merely examples, and therefore do not limit the scope of the present invention. In addition, among the structural elements in the following exemplary embodiments, those not recited in any one of the independent claims which indicate the broadest inventive concepts are described as optional elements.

Figure 1A:
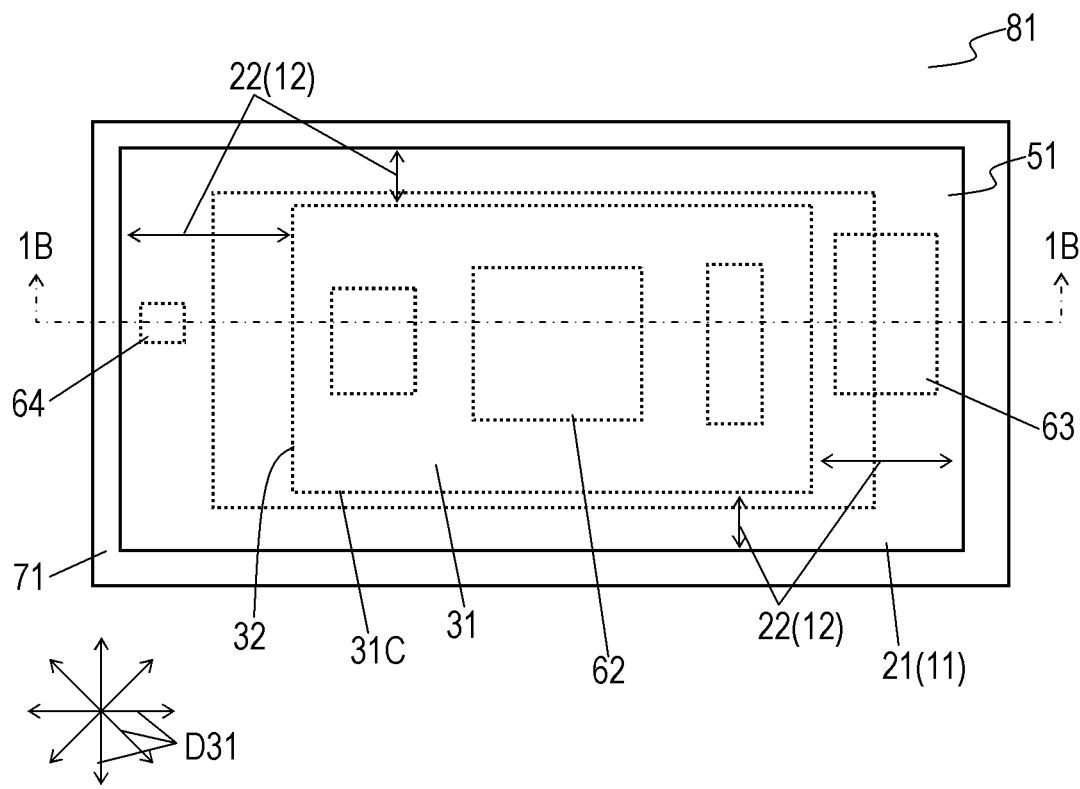
FIG. 1A is a top view of an electronic apparatus including a heat conductive sheet according to an exemplary embodiment.
Figure 1B:
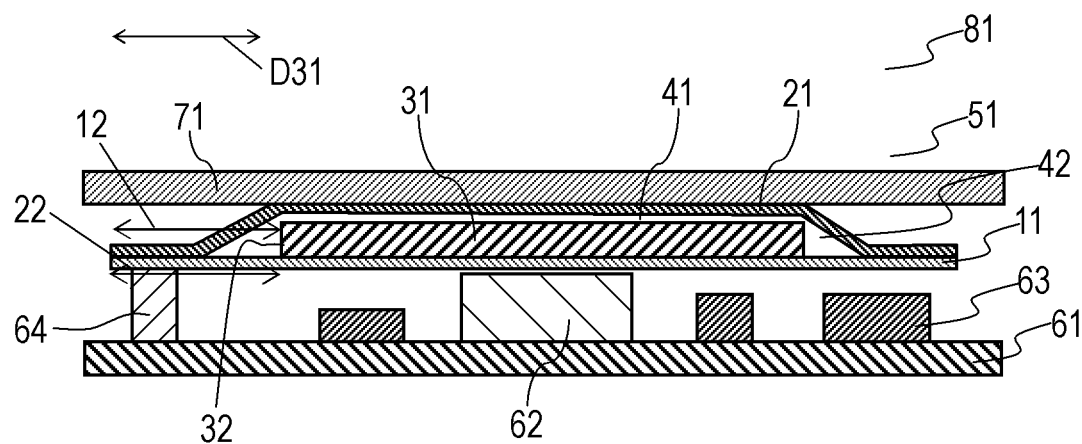
FIG. 1B is a cross-sectional view of the electronic apparatus along line 1B-1B shown in FIG. 1A.

FIG. 1A is a top view of electronic apparatus 81 including heat conductive sheet 51 according to an exemplary embodiment. FIG. 1B is a cross-sectional view of electronic apparatus 81 along line 1B-1B shown in FIG. 1A.

Heat conductive sheet 51 includes heat dissipating sheet 31, heat insulating layer 41 provided on an upper surface of heat dissipating sheet 31, sheet 21 provided on an upper surface of heat insulating layer 41, and sheet 11 provided on a lower surface of heat dissipating sheet 31. In other words, heat insulating layer 41 is provided above heat dissipating sheet 31, sheet 21 is provided above heat insulating layer 41, and sheet 11 is provided below heat dissipating sheet 31.

Sheet 11 includes protruding portion 12 that protrudes, viewing from above, in surface directions D31 parallel to the upper surface and the lower surface of heat dissipating sheet 31. Protruding portion 12 surrounds, viewing from above, heat dissipating sheet 31 along outer periphery 31C of heat dissipating sheet 31. Sheet 21 includes protruding portion 22 that protrudes, viewing from above, in surface directions D31 of heat dissipating sheet 31. Protruding portion 22 surrounds, viewing from above, heat dissipating sheet 31 along outer periphery 31C of heat dissipating sheet 31. Protruding portions 12 and 22 may entirely surround heat dissipating sheet 31 viewing from above. The thermal conductivity of heat insulating layer 41 is lower than any of the thermal conductivity of sheet 11, the thermal conductivity of sheet 21, and the thermal conductivity of heat dissipating sheet 31. Protruding portion 12 overlaps protruding portion 22 viewing from above.

Heat conductive sheet 51 further includes heat insulating layer 42 contacting edge surface 32 of heat dissipating sheet 31. Edge surface 32 is connected to the upper surface and the lower surface of heat dissipating sheet 31. Heat insulating layer 42 is surrounded by edge surface 32 of heat dissipating sheet 31, the lower surface of sheet 11, and the upper surface of sheet 21. The thermal conductivity of heat insulating layer 42 is lower than any of the thermal conductivity of heat dissipating sheet 31 and sheets 11 and 12.

Mounting substrate 61 is provided below sheet 11. Heat generating component 62, electronic component 63, and temperature dependent component 64 are mounted on mounting substrate 61. Heat generating component 62 is joined to the lower surface of sheet 11, and overlaps heat dissipating sheet 31 viewing from above. Electronic component 63 is not joined to the lower surface of sheet 11. Temperature dependent component 64 is joined to the lower surface of sheet 11, and does not overlap heat dissipating sheet 31 viewing from above. Liquid crystal panel 71 is provided above the upper surface of sheet 21.

Heat dissipating sheet 31 is a graphite sheet produced by thermally decomposing a polyimide resin. The thickness of heat dissipating sheet 31 is 0.05 mm. The thermal conductivity of heat dissipating sheet 31 along surface direction D31 is about 1300 W/m·K. The thermal conductivity of heat dissipating sheet 31 along a direction perpendicular to surface direction D31 is about 1/100 the thermal conductivity of heat dissipating sheet 31 along surface direction D31, that is, about 13 W/m·K. Heat dissipating sheet 31 may be made of a natural graphite sheet formed by compressing graphite powder.

Sheet 11 is a double-sided adhesive tape containing an acrylic adhesive agent, and has a thickness of 0.01 mm. Sheet 11 may be a double-sided adhesive tape containing a silicone adhesive agent.

Sheet 21 is made of polyethylene terephthalate (PET), and has a thickness of 0.01 mm. Sheet 21 may made of polyimide.

Each of heat insulating layer 41 and heat insulating layer 42 may be implemented by a gap filled with air. Specifically, the lower surface of sheet 21 is arranged so as to provide a gap from the upper surface of heat dissipating sheet 31 in a region outside heat dissipating sheet 31, the lower surface of sheet 21 is arranged so as to have a gap (i.e., heat insulating layer 42) from the upper surface of sheet 11. The thermal conductivity of air is lower than the thermal conductivity of the graphite sheet and the thermal conductivity of PET, so that heat insulating layers 41 and 42 containing air provide high thermal insulation effect. Heat insulating layers 41 and 42 are made of a material having a thermal conductivity lower than any of the thermal conductivities of sheet 11, sheet 21, and heat dissipating sheet 31. For the materials of sheet 11, sheet 21, and heat dissipating sheet 31 described above, heat insulating layer 41 and heat insulating layer 42 may be made of a urethane material other than air.

Heat insulating layers 41 and 42 filled with air may partially communicate with each other.

Figure 2:
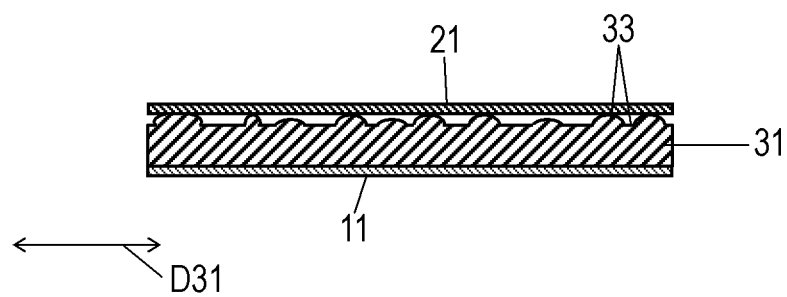
FIG. 2 is an enlarged cross-sectional view of the heat conductive sheet shown in FIG. 1B.

FIG. 2 is an enlarged cross-sectional view of heat conductive sheet 51 shown in FIG. 1B for illustrating a region near heat insulating layer 41.

Heat insulating layer 41 is a gap that is formed between sheet 21 and asperities 33 of heat dissipating sheet 31 and that is filled with air. Heat insulating layer 41 is formed in a layer configuration so as to be connected along surface directions D31 of heat dissipating sheet 31. Heat insulating layer 41 is formed by arranging sheet 21 on the upper surface of the heat dissipating sheet 31 having asperities 33 on a surface thereof.

Heat generating component 62 may be implemented by, for example, a Central Processing Unit (CPU) which generates a large amount of heat in operation thereof. Heat generating component 62 is provided at a position overlapping heat dissipating sheet 31 viewing from above while sheet 11 is provided between heat generating component 62 and heat dissipating sheet 31. Since liquid crystal panel 71 generally has low heat resistance, and may have color unevenness in a partial area of an image displayed on the panel due to an adverse effect of heat. Heat generating component 62 at the position overlapping heat dissipating sheet 31 viewing from above enables the heat generated by heat generating component 62 to efficiently dissipate to heat dissipating sheet 31, and reduces the adverse effect of heat on liquid crystal panel 71.

Temperature dependent component 64 is a component that has characteristics changing due to a temperature change. Temperature dependent component 64 includes a temperature compensated crystal oscillator (TCXO). Taking the adverse effect from heat into consideration, temperature dependent component 64 may be preferably disposed at a position away from heat generating component 62, but may still have an adverse effect due to the heat transmitted from heat dissipating sheet 31.

Heat conductive sheet 51 will be detailed below.

In the heat dissipating sheets disclosed in PTL 1 and PTL 2, the heat transmitted through the heat dissipating sheets may heat up various components, causing problems in the operations of the electronic apparatus.

In the heat conductive sheet disclosed in PTL 1, a protective layer and an adhesive layer contact an edge surface of a graphite sheet which has heat dissipation capability. On the other hand, in heat conductive sheet 51 according to the exemplary embodiment, heat insulating layer 42 contacts edge surface 32 of heat dissipating sheet 31, and moreover, heat insulating layer 42 surrounds heat dissipating sheet 31 along the outer periphery of heat dissipating sheet 31 viewing from above. Therefore, heat conductive sheet 51 according to the exemplary embodiment can block the heat transmitted through heat dissipating sheet 31 in surface directions D31 of heat dissipating sheet 31.

With the above-described structure, temperature dependent component 64 provided at the position that does not overlap heat dissipating sheet 31 viewing from above is unlikely to be affected by the heat transmitted from heat dissipating sheet 31.

In the heat conductive sheet disclosed in PTL 2, a protective sheet and a graphite sheet having heat dissipation capability are joined with an adhesive agent. On the other hand, heat conductive sheet 51 according to the exemplary embodiment has heat insulating layer 41 provided between heat dissipating sheet 31 and sheet 11. Therefore, liquid crystal panel 71 is not easily affected by heat.

In addition, since the graphite sheet used for heat dissipating sheet 31 has electrical conductivity, the graphite sheet may cause a short circuit in the electronic apparatus if a part of the graphite sheet drops off. In heat conductive sheet 51 according to the exemplary embodiment, heat dissipating sheet 31 is hermetically sealed by protruding portion 22 adhesive-bonded to protruding portion 12 made of a double-sided adhesive tape. Therefore, heat dissipating sheet 31 does not drop off in electronic apparatus 81.

Alternatively, protruding portions 12 and 22 may be heat-bonded to each other by heat-melting so as to hermetically seal heat dissipating sheet 31.

A method of manufacturing heat conductive sheet 51 will be described below.

Figure 3A:
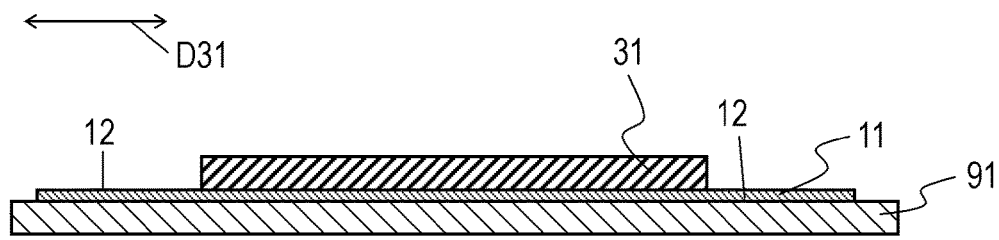
FIG. 3A is a cross-sectional view of the heat conductive sheet according to the embodiment for illustrating a method of manufacturing the heat conductive sheet.
Figure 3B:
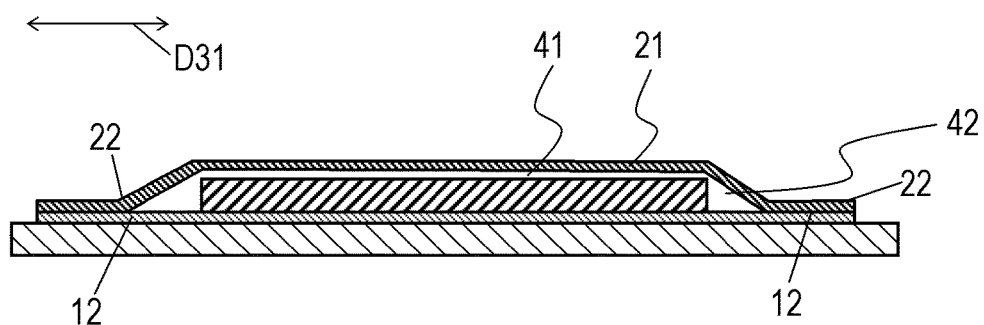
FIG. 3B is a cross-sectional view of the heat conductive sheet according to the embodiment for illustrating the method of manufacturing the heat conductive sheet.

FIGS. 3A and 3B are flow-charts illustrating a method of manufacturing heat conductive sheet 51.

In the method of manufacturing heat conductive sheet 51, release sheet 91 made of PET is first prepared as illustrated in FIG. 3A. Then, sheet 11 made of a double-sided adhesive tape is provided on the upper surface of release sheet 91. Next, heat dissipating sheet 31 made of a graphite sheet is provided on the upper surface of sheet 11. Heat dissipating sheet 31 is provided such that sheet 11 includes protruding portion 12 protruding in surface directions D31 of heat dissipating sheet 31.

Release sheet 91 is provided for improving hand ability during manufacturing.

Next, as illustrated in FIG. 3B, sheet 21 is provided to cover an upper region of heat dissipating sheet 31 and includes include protruding portion 22 protruding in the surface directions of heat dissipating sheet 31. Heat dissipating sheet 31 is hermetically sealed with protruding portion 22 adhesive bonded onto the upper surface of protruding portion 12 made of a double-sided adhesive tape. In this case, the position at which protruding portion 22 is adhesive-bonded to protruding portion 12 which is made of a double-sided adhesive tape is adjusted to adjust the thickness of heat insulating layer 41 which includes a gap, and to adjust the width of heat insulating layer 42 in surface direction D31 of heat dissipating sheet 31.

Heat conductive sheet 51 may be manufactured through the above-described steps.

Figure 3C:
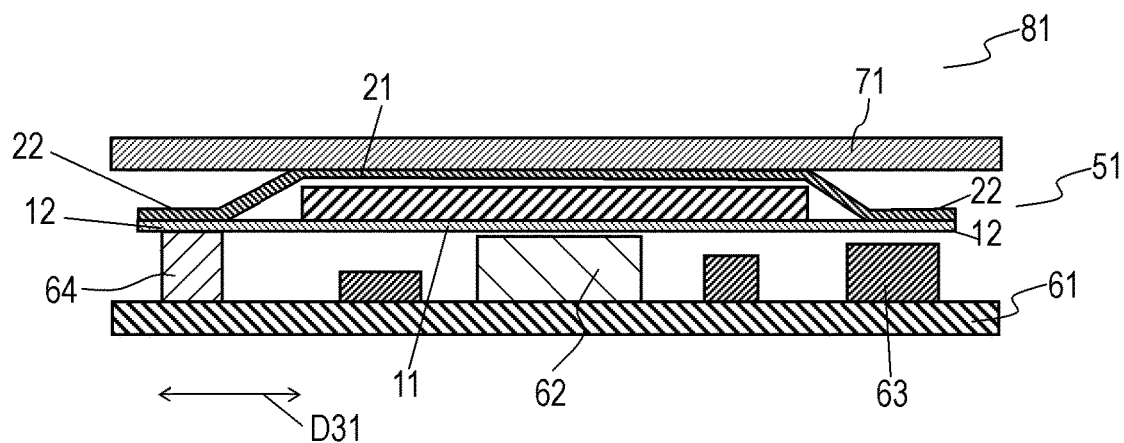
FIG. 3C is a cross-sectional view of an electronic apparatus including the heat conductive sheet according to the embodiment for illustrating a method of manufacturing the electronic apparatus.

A method of manufacturing electronic apparatus 81 including heat conductive sheet 51 will be described below. FIG. 3C is a cross-sectional view of electronic apparatus 81 using heat conductive sheet 51.

As illustrated in FIG. 3C, heat generating component 62 is arranged below the lower surface of sheet 11 which is a double-sided adhesive tape exposed by peeling off release sheet 91 so as to overlap the heat dissipating sheet viewing from above. Further, temperature dependent component 64 is arranged below the lower surface of sheet 11 so as not to overlap the heat dissipating sheet viewing from above. Liquid crystal panel 71 is provided above the upper surface of sheet 21. Electronic apparatus 81 including heat conductive sheet 51 may be manufactured in the above-described method.

In the exemplary embodiments, terms, such as "upper surface", "lower surface", "above", "below", and "viewing from above", indicating directions merely indicate relative directions determined only by relative positional relationships among structural components of the heat conductive sheet [A4], and do not indicate absolute directions, such as a vertical direction.

INDUSTRIAL APPLICABILITY

A heat conductive sheet according to the present disclosure can efficiently dissipate heat generated by heat generating components, and is therefore industrially useful.

REFERENCE MARKS IN THE DRAWINGS 11 sheet (first sheet)
12 protruding portion
21 sheet (second sheet)
22 protruding portion
31 heat dissipating sheet
32 edge surface
33 surface irregularities
41 heat insulating layer (first heat insulating layer)
42 heat insulating layer (second heat insulating layer)
51 heat conductive sheet
61 mounting substrate
62 heat generating component
63 electronic component
64 temperature dependent component
71 liquid crystal panel
81 electronic apparatus
91 release sheet

The invention claimed is:

1. A heat conductive sheet comprising:
   a heat dissipating sheet;
   a first heat insulating layer provided above the heat dissipating sheet;
   a first sheet provided above the first heat insulating layer; and
   a second sheet provided below the heat dissipating sheet, wherein
   the first sheet includes a first protruding portion protruding from the heat dissipating sheet viewing from above,
   the second sheet includes a second protruding portion protruding from the heat dissipating sheet viewing from above,
   a thermal conductivity of the first heat insulating layer is lower than any of a thermal conductivity of the first sheet, a thermal conductivity of the second sheet, and a thermal conductivity of the heat dissipating sheet, and
   the first protruding portion overlaps the second protruding portion viewing from above.

2. The heat conductive sheet according to claim 1, further comprising an adhesive layer bonding the first sheet to the second sheet together.

3. The heat conductive sheet according to claim 1, wherein the first sheet is joined to the second sheet by melt-bonding.

4. The heat conductive sheet according to claim 1, wherein
   the first protruding portion surrounds the heat dissipating sheet along an outer periphery of the heat dissipating sheet viewing from above, and
   the second protruding portion surrounds the heat dissipating sheet along the outer periphery of the heat dissipating sheet viewing from above.

5. The heat conductive sheet according to claim 1, further comprising
   a second heat insulating layer contacting an edge surface of the heat dissipating sheet, the edge surface of the heat dissipating sheet being connected to an upper surface of the heat dissipating sheet and a lower surface of the heat dissipating sheet,
   wherein a thermal conductivity of the second heat insulating layer is lower than the thermal conductivity of the heat dissipating sheet.

6. The heat conductive sheet according to claim 5, wherein
   the second heat insulating layer is surrounded by the first sheet, the second sheet, and the edge surface of the heat dissipating sheet, and
   the thermal conductivity of the second heat insulating layer is lower than the thermal conductivity of the first sheet and the thermal conductivity of the second sheet.

7. The heat conductive sheet according to claim 6, wherein the second heat insulating layer surrounds the heat dissipating sheet along an outer periphery of the heat dissipating sheet.

8. The heat conductive sheet according to claim 7, wherein each of the first heat insulating layer and the second heat insulating layer comprises a gap.

9. An electronic apparatus comprising:
   the heat conductive sheet according to claim 5;
   a heat generating component provided below the second sheet of the heat conductive sheet; and
   a temperature dependent component provided below the second sheet of the heat conductive sheet, wherein the heat generating component overlaps the heat dissipating sheet of the heat conductive sheet viewing from above, and the temperature dependent component does not overlap the heat dissipating sheet viewing from above.

10. An electronic apparatus comprising:

the heat conductive sheet according to claim 1;

a liquid crystal panel provided above the first sheet of the heat conductive sheet; and a heat generating component provided below the second sheet of the heat conductive sheet, wherein both the liquid crystal panel and the heat generating component overlap the heat dissipating sheet of the heat conductive sheet viewing from above.

* * * * *